(12) United States Patent
Li

(10) Patent No.: US 11,152,498 B2
(45) Date of Patent: Oct. 19, 2021

(54) SEMICONDUCTOR DEVICE AND METHOD OF MANUFACTURING THE SAME

(71) Applicant: GUANGDONG ZHINENG TECHNOLOGY CO., LTD., Guangzhou (CN)

(72) Inventor: Zilan Li, Guangzhou (CN)

(73) Assignee: GUANGDONG ZHINENG TECHNOLOGY CO., LTD., Guangdong (CN)

(*) Notice: Subject to any disclaimer, the term of this patent is extended or adjusted under 35 U.S.C. 154(b) by 0 days.

(21) Appl. No.: 16/723,384

(22) Filed: Dec. 20, 2019

(65) Prior Publication Data

US 2021/0066485 A1    Mar. 4, 2021

(30) Foreign Application Priority Data

Aug. 30, 2019  (CN) .......................... 201910817283.1

(51) Int. Cl.
*H01L 29/778* (2006.01)
*H01L 29/66* (2006.01)

(52) U.S. Cl.
CPC .... *H01L 29/7786* (2013.01); *H01L 29/66462* (2013.01)

(58) Field of Classification Search
CPC .................... H01L 29/7786; H01L 29/66462
See application file for complete search history.

(56) References Cited

U.S. PATENT DOCUMENTS

| | | | | |
|---|---|---|---|---|
| 2014/0264379 A1* | 9/2014 | Kub | ............... | H01L 29/66477 |
| 2016/0380091 A1* | 12/2016 | Okawa | ............... | H01L 29/7788 |
| | | | | 257/194 |
| 2018/0151715 A1* | 5/2018 | Chowdhury | ........ | H01L 29/7827 |
| 2019/0252186 A1* | 8/2019 | Aktas | ............... | H01L 21/02579 |
| 2020/0020779 A1* | 1/2020 | Trang | ............... | H01L 23/528 |
| 2020/0027872 A1* | 1/2020 | Boles | ............... | H01L 29/205 |
| 2020/0105916 A1* | 4/2020 | Moens | ............ | H01L 29/41775 |
| 2020/0287033 A1* | 9/2020 | Suh | ............... | H01L 29/0692 |
| 2020/0335617 A1* | 10/2020 | Banerjee | ........ | H01L 29/42316 |

* cited by examiner

*Primary Examiner* — Victor A Mandala
(74) *Attorney, Agent, or Firm* — George S. Blasiak; Heslin Rothenberg Farley & Mesiti PC

(57) ABSTRACT

The present disclosure provides a semiconductor device and a method of fabricating the same. The device comprises a substrate; a first semiconductor layer formed on the substrate; a second semiconductor layer formed on the first semiconductor layer; the first semiconductor layer having a smaller forbidden band width than the second semiconductor layer; and a first electrode, a second electrode, and a third electrode formed on the second semiconductor layer; the first semiconductor layer corresponding to the third electrode has a strongly P-type doped first region, and the first semiconductor layer corresponding to the second electrode has a weakly P-type doped second region. The present disclosure contributes to achievement of one of the effects of: reducing a gate leakage current, having a high threshold voltage, high power, and high reliability, allowing a low on-resistance and a normally-off state of the device, and providing a stable threshold voltage, so that the semiconductor device has good switching characteristics.

19 Claims, 10 Drawing Sheets

SEMICONDUCTOR DEVICE AND METHOD OF MANUFACTURING THE SAME

CROSS-REFERENCE TO RELATED APPLICATIONS

This application claims priority to Chinese Patent Application No. 201910817283.1, filed with the Chinese Patent Office on Aug. 30, 2019, entitled "Semiconductor Device and Method of Manufacturing the Same", which is incorporated herein by reference in its entirety.

BACKGROUND ART

Group III nitride semiconductors are an important new type of semiconductor materials, mainly including AlN, GaN, InN, and compounds of these materials such as AlGaN, InGaN, AlInGaN, and the like. The Group III nitride semiconductors have broad prospects of application in the fields of light emitting devices, power electronics, radio frequency devices, and the like due to their advantages such as direct band gap, wide forbidden band, high breakdown electric field strength, and high saturation electron speed.

It. is desirable to develop a semiconductor device having high properties such as high withstand voltage, high power, and low on-resistance by utilizing the advantages of the group III nitride semiconductors by an optimized design of the device structure and process.

SUMMARY

A brief summary of the present disclosure will be set forth below in order to provide a basic understanding of some aspects of the present disclosure. It should be understood that this summary is not an exhaustive overview of the present disclosure. It is not intended to identify key or critical parts of the present disclosure or to delineate the scope of the present disclosure. Its sole purpose is to present some concepts in a simplified form as a prelude to the more detailed description that is discussed later.

In a first aspect, the present disclosure provides a semiconductor device comprising: a substrate; a first semiconductor layer disposed on a first surface of the substrate; a second semiconductor layer disposed on a first surface of the first semiconductor layer; a two-dimensional charge carrier gas being generated between the first semiconductor layer and the second semiconductor layer; and a first electrode, a second electrode, and a third electrode disposed on the second semiconductor layer;
wherein the first semiconductor layer further comprises a strongly P-type doped first region and a weakly P-type doped second region; the first region is located under the third electrode, and the second region is located under the second electrode.

In a second aspect, the present disclosure provides a method of manufacturing a semiconductor device, comprising: a step 100 of providing a substrate; a step 200 of forming a first semiconductor layer on a first surface of the substrate; a step 300 of forming a strongly P-type doped first region and a weakly P-type doped second region in the first semiconductor layer; a step 400 of forming a second semiconductor layer on a first surface of the first semiconductor layer, a two-dimensional charge carrier gas being generated between the first semiconductor layer and the second semiconductor layer; and a step 500 of forming a first electrode and a second electrode brought into ohmic contact with the two-dimensional charge carrier gas, and forming a third electrode on a side of a first surface of the second semiconductor layer; wherein the first region is located under the third electrode, and the second region is located under the second electrode.

According to another aspect of the present disclosure, an electronic apparatus comprising a semiconductor device described in the present disclosure is provided.

BRIEF DESCRIPTION OF DRAWINGS

The present disclosure will be described below with reference to the accompanying drawings, which will facilitate an easier understanding of the above and other objects, features, and advantages of the present disclosure. The drawings are only intended to illustrate the principles of the present disclosure. The dimensions and relative positions of elements are not necessarily drawn to scale in the drawings. In the figures.

DETAILED DESCRIPTION OF EMBODIMENTS

Exemplary implementations of the present disclosure will be described hereinafter with reference to the accompanying drawings. In the interest of clarity and conciseness, not all features of an actual implementation are described in the specification. However, it will be appreciated that in the development of any such actual implementation, numerous implementation-specific decisions can be made to achieve the developers' specific goals, which will vary from one implementation to another.

It is also to be noted here that, in order to avoid obscuring the present disclosure due to unnecessary details, only the device structures closely related to the solution according to the present disclosure are shown in the figures, and other details less related to the present disclosure are omitted.

It should be understood that the present disclosure is not limited to the described embodiments as described below with reference to the accompanying drawings. Here, wherever practicable, features between different embodiments may be substituted or exchanged with each other, and one or more features may be omitted in one embodiment.

A semiconductor device according to the present disclosure is a compound semiconductor device. Optionally, the compound semiconductor device may be a compound semiconductor device containing a nitride semiconductor material, which is also referred to as a nitride semiconductor device. The nitride semiconductor device includes a field effect transistor in which a nitride semiconductor material is used. Here, the field effect transistor may be a GaN field effect transistor containing a GaN semiconductor material. Optionally, the GaN field effect transistor may be a normally-off transistor GaN-HEMT.

Figure 1:
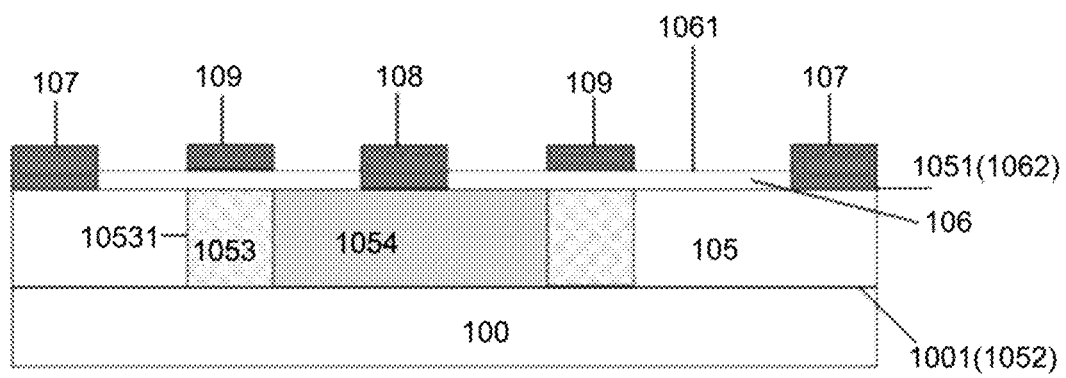
FIG. 1 illustrates a schematic cross-sectional view of a semiconductor device structure according to the present disclosure.

Referring to FIG. 1, a schematic structural view of a semiconductor device according to this embodiment is shown.

As shown in FIG. 1, in this embodiment, taking a semiconductor device which is a normally-off transistor GaN-HEMT as an example, the semiconductor device may comprise a substrate 100, a first semiconductor layer 105, a second semiconductor layer 106, a first electrode 107, a second electrode 108, and a third electrode 109.

The material of the substrate 100 may be selected according to actual requirements, and the specific form of the substrate 100 is not limited in this embodiment.

For example, the substrate 100 may be made of sapphire, ZnO, SiC, AlN, GaAs, LiAlO, GaAlLiO, GaN, $Al_2O_3$, single crystal silicon, or the like; for another example, the substrate 100 may be an $Al_2O_3$ (0001) substrate; for still another example, the substrate 100 may be a silicon (111) substrate.

The first semiconductor layer 105 is formed on a first surface 1001 of the substrate 100, and optionally, the first semiconductor layer 105 is a GaN layer. Further, the first semiconductor layer 105 may be an intrinsic GaN layer (i-GaN, i.e., an intrinsic nitride) or an unintentionally doped GaN layer. Here, in the case where the first semiconductor layer 105 is an intrinsic nitride layer or an unintentionally doped nitride layer, an epitaxial direction of the first semiconductor layer parallel to the substrate 100 is substantially in a [0001] direction.

In this embodiment, the first semiconductor layer 105 has a first surface 1051 and a second surface 1052, wherein the second surface 1052 is opposite to the first surface 1001 of the substrate 100, and the first surface 1051 faces away from the first surface 1001 of the substrate 100. An epitaxial direction of the GaN layer parallel to the substrate is substantially parallel to the [0001] orientation.

The second semiconductor layer 106 is formed on the first surface 1051 of the first semiconductor layer 105. In this embodiment, the first semiconductor layer 105 has a smaller forbidden band width than the second semiconductor layer 106, so that a two-dimensional charge carrier gas such as 2DEG (Two-dimensional electron gas) can be formed between the first semiconductor layer 105 and the second semiconductor layer 106. The second semiconductor layer 106 has a first surface 1061 and a second surface 1062, wherein the second surface 1062 is opposite to the first surface 1051 of the first semiconductor layer 105, and the first surface 1061 faces away from the first surface of the first semiconductor layer 105. Optionally, the second semiconductor layer 106 may be a layer of AlGaN, InAlGaN, InAlN, or the like.

The first electrode 107, the second electrode 108, and the third electrode 109 are formed on the second semiconductor layer 106. The first electrode 107 may be a drain that forms an ohmic contact with the two-dimensional charge carrier gas; the third electrode 109 may be a gate that forms a Schottky contact with the second semiconductor layer 106 to reduce an off-state leakage current; and the second electrode 108 is a source that forms an ohmic contact with the two-dimensional charge carrier gas. It is clear that the first electrode 107 and the second electrode 108 may also be a corresponding doped region (drain region) and another doped region (source region) of the device.

The first semiconductor layer 105 may comprise a strongly (or heavily) P-type doped first region 1053 which is projected onto the substrate 100 in a region falling within a range of a region where the third electrode 109 is projected onto the substrate 100. The strongly P-type doped first region 1053 exemplarily has a dopant concentration of 1E+18 atoms/$cm^3$ to 5E+19 atoms/$cm^3$. Typically, the first region 1053 may have a dopant concentration of greater than 5E+18 atoms/$cm^3$. Still further, the strongly P-type doped first region 1053 may be parallel to a direction of movement of the two-dimensional charge carriers, and the first region 1053 has a length in the range of greater than 0 and less than or equal to (<) the length of the third electrode 109 (i.e., less than or equal to the gate length).

In this embodiment, the strongly P-type doped first region 1053 may be a layer structure with a gradually varying dopant concentration. For example, the strongly P-type doped first region 1053 may have a dopant concentration gradually varying along a single side of the lengthwise direction, or gradually varying from a center of the first region 1053 to both sides of a direction parallel to the substrate 100 (the lengthwise direction of the first semiconductor layer 105), or gradually varying from the center of the first region 1053 to both sides of a direction perpendicular to the substrate 100 (a thickness direction of the first semiconductor layer 105).

Figure 2A:
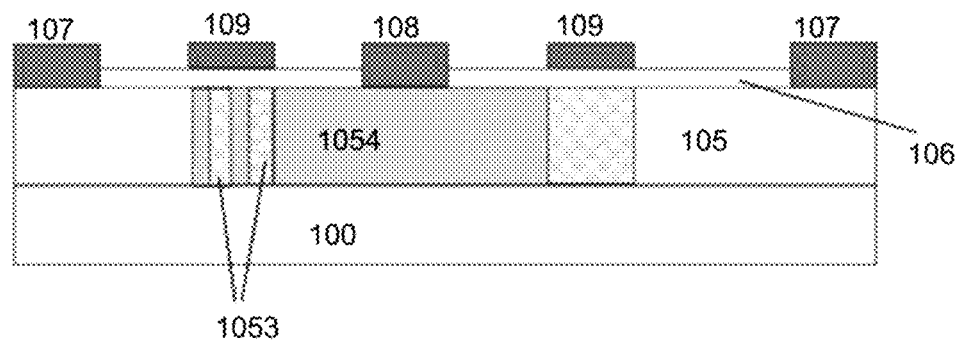
FIGS. 2*a* to 2*c* illustrate schematic cross-sectional views of variation examples of the semiconductor device structure shown in FIG. 1.
Figure 2B:
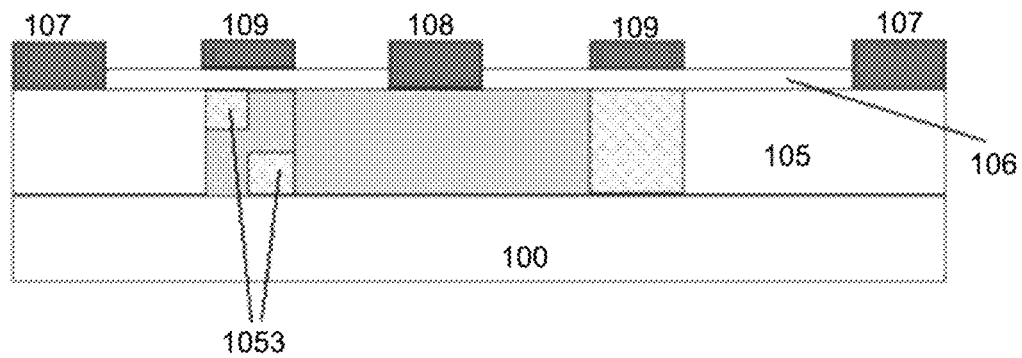
Figure 2C:
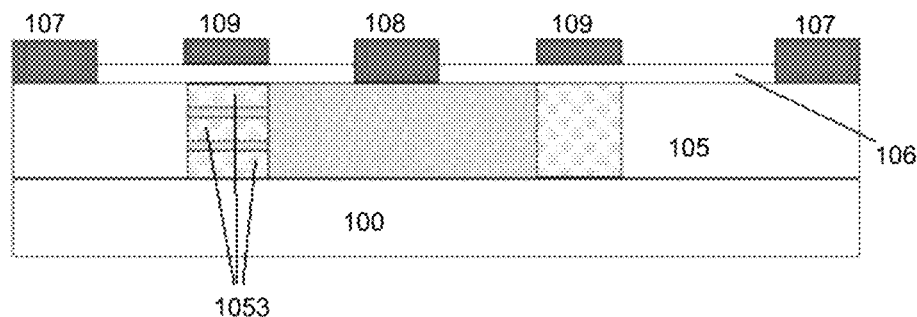

The strongly P-type doped first region 1053 has a thickness greater than 0 and less than or equal to the thickness of the first semiconductor layer 105. The strongly P-type doped first region 1053 may be a single layer structure or may comprise a plurality of (two or more) discrete layers. Here, the plurality of discrete layers may be disposed along the lengthwise direction of the first semiconductor layer 105 (i.e., the direction parallel to the substrate 100) as shown in FIG. 2a, or the plurality of discrete layers may be disposed along the thickness direction of the first semiconductor layer 105 (i.e., the direction perpendicular to the substrate 100) as shown in FIGS. 2b to 2c.

When the plurality of discrete layers are disposed along the thickness direction of the first semiconductor layer 105, the plurality of discrete layers may at least partially overlap one another when orthographically projected, or may not overlap when orthographically projected. The plurality of discrete layers may be spaced apart from one another, or may not be spaced apart and may be brought into close contact with one another. In the case where they are spaced apart, the plurality of discrete layers may be spaced apart by a weakly P-type doped region. Still further, in addition to being located within an overlap range between the projection regions of the first semiconductor layer 105 and the third electrode 109, the strongly P-type doped first region 1053 may extend from the overlap range toward both ends along a direction perpendicular to the movement of the two-dimensional charge carriers.

The first semiconductor layer 105 may further comprise a weakly (or lightly) P-type doped second region 1054 extending from a region overlapping the projection region of the second electrode 108 toward both ends along a direction parallel to the movement of the two-dimensional charge carriers, and the second region 1054 is connected to the first region 1053. The second region has a thickness greater than 0 and less than or equal to the thickness of the first semiconductor layer 105. The second region 1054 exemplarily has a dopant concentration of less than 5E+18 atoms/cm$^3$, such as 1E+18 atoms/cm$^3$, 5E+17 atoms/cm$^3$, or the like. In the semiconductor device (HEMT) described above, the strong P-type doping in the first region 1053 and the weak P-type doping in the second region 1054 are relative to each other and are related to the two-dimensional charge carrier gas formed between the first semiconductor layer 105 and the second semiconductor layer 106.

When a higher concentration of an intrinsic two-dimensional charge carrier gas exists at an interface between the first semiconductor layer 105 and the second semiconductor layer 106, the strong P-type doping is corresponding to a higher dopant concentration, and thus a dopant concentration corresponding to the weak P-type doping may also be relatively increased compared with the usual case. Conversely, when the intrinsic two-dimensional charge carrier gas is at a lower concentration, the strong P-type doping is corresponding to a lower dopant concentration, and thus a dopant concentration corresponding to the weak P-type doping may also be relatively decreased compared with the usual case. In the same device, the dopant concentration for the strong P-type doping may exemplarily be twice or more than twice the dopant concentration for the weak P-type doping.

Figure 3:
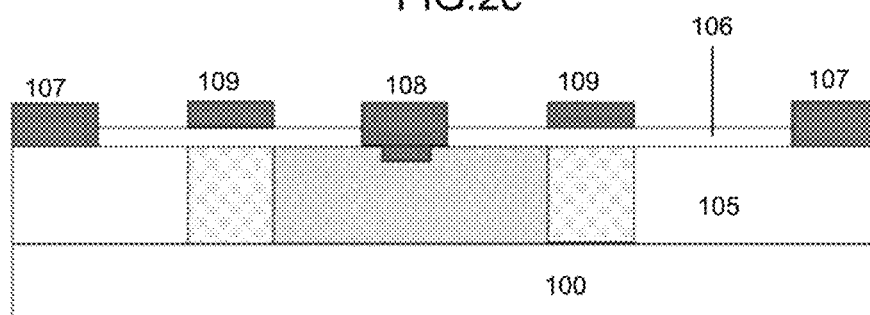
FIG. 3 illustrates a schematic cross-sectional view of a variation example of the semiconductor device structure shown in FIG. 1.

As shown in FIG. 3, the second electrode 108 may form an ohmic contact with the weakly P-type doped second region 1054 such that a potential of the strongly P-type doped first region 1053 communicates with the second electrode 108 via the weakly P-type doped second region 1054. Further, a metal element in the second electrode 108 that forms an ohmic contact with the two-dimensional charge carrier gas may be the same as or different from a doping element in the weakly P-type doped second region 1054 for forming an ohmic contact.

The first region 1053 of the first semiconductor layer 105 may deplete two-dimensional charge carriers located thereabove due to having a lower Fermi level, thereby resulting in a higher threshold voltage of the device and a normally-off state of the device. The setting of the first region 1053, such as its thickness, length, width, P-type dopant concentration, etc., may be set by device parameters to meet the requirement of depleting 95% to 100% of the two-dimensional charge carriers located thereabove. In other words, in this embodiment, the first region 1053 depletes 95% to 100% of the two-dimensional charge carrier gas at its location overlapping the region where the third electrode 109 is projected. Exemplarily, when the third electrode 109 has a gate bias voltage of 0, a concentration of the two-dimensional charge carrier gas in at least a portion of the region under the third electrode 109 is less than 5E+11/cm$^2$. The first region 1053 disposed within the range of the gate length can rapidly deplete the two-dimensional charge carrier gas so as to improve its performance parameters, thereby causing the device to have a lower on-resistance and good switching characteristics.

The second region 1054 of the first semiconductor layer 105 has a lower P-type dopant concentration to protect the two-dimensional charge carrier gas in the second region 1054 so that it is kept at a relatively high concentration. Exemplarily, the setting of the second region 1054, such as its thickness, length, width, P-type dopant concentration, etc., may be set by device parameters to meet the requirement of depleting less than 80% of the two-dimensional charge carrier gas located thereabove. The arrangement of the second region 1054 is associated with both a distance from the second region to a channel and the two-dimensional charge carrier gas. Exemplarily, the concentration of the two-dimensional charge carrier gas in the second region 1054 is not lower than 2E+12/cm$^2$.

Further, the first region 1053 has a first surface and a second surface, the first surface of the first region 1053 faces away from the first surface 1001 of the substrate 100, and the second surface of the first region 1053 is opposite to the first surface of the substrate 100. The first region 1053 further has a third surface (e.g., a side plane) which is connected to the first surface and the second surface of the first region 1053. The third surface of the first region 1053 forms an angle C with the second surface of the first region 1053. The angle C may be between 30 degrees and 90 degrees.

Optionally, the direction of lateral growth (i.e., the direction of lateral epitaxy) of the first region is [11$\bar{2}$0], but it will be understood that this description is merely exemplary.

Further, a threshold voltage of the device may be controlled by settings of a doping element and a dopant concentration of the first region 1053, a distance between the first region 1053 and the second semiconductor layer 106, the width of the first region 1053, the material of the gate electrode, and the components and thickness of the second semiconductor layer 106. In one example, the first region 1053 may have a dopant concentration of about 1E+18 to 5E+19 atoms/cm$^3$, for example, 1E+17 atoms/cm$^3$, 1E+18 atoms/cm$^3$, 1E+19 atoms/cm$^3$, or 5E+19 atoms/cm$^3$; the material of the third electrode 109 may be TiN, Ni, ITO, Au, or the like, and the first region 1053 may have a length of about 0.01 to 10 microns and a thickness of about 0.01 to 10 microns. The length of the first region 1053 (i.e., the length along the direction of flow of the charge carriers) may, exemplarily, be controlled by precisely controlling process parameters such as epitaxy duration during lateral epitaxy to achieve the control of a very thin width. Since a depletion region generally has a relatively high resistance, a reduction in width of this portion allows an effective reduction in on-state resistance of the device, and also facilitates a reduction in size of the device and an increase in rate of utilization of the area of a wafer.

Figure 4:
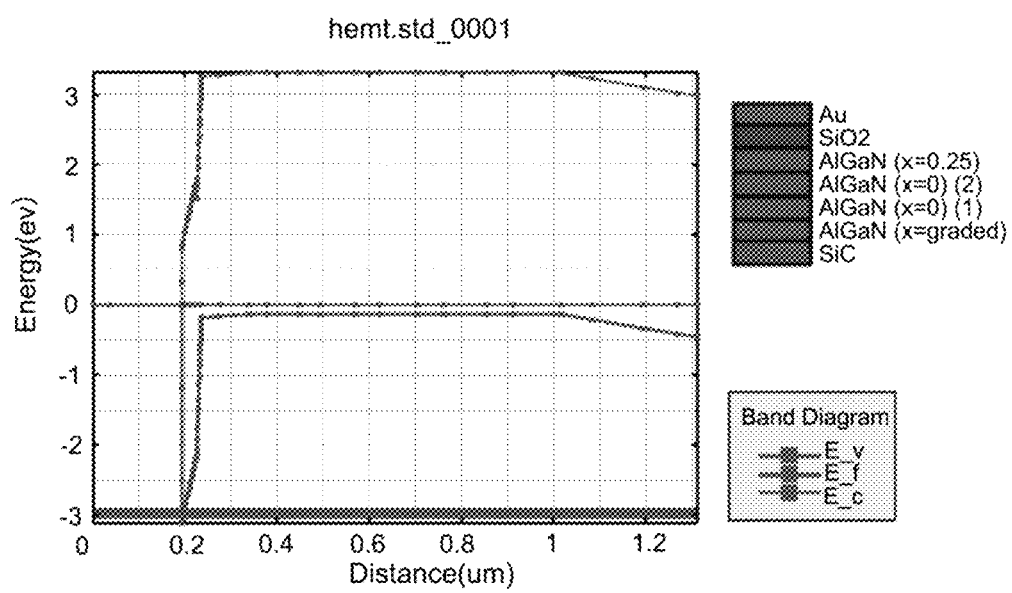
FIG. 4 illustrates an energy band diagram of the semiconductor device of FIG. 1.

FIG. 4 is an energy band diagram of the semiconductor device. In the present disclosure, when the first region 1053 is disposed under the third electrode 109, the semiconductor device has a narrow depletion layer which rapidly depletes the two-dimensional carrier charges, so that a controllable depletion of the two-dimensional electron gas can be effectively achieved at a location of the semiconductor device corresponding to the third electrode 109 (gate stack); when the first region is disposed away from the third electrode 109, the two-dimensional electron gas outside the location corresponding to the third electrode 109 (gate stack) will be depleted without being controllable by the third electrode 109, and as a result, the semiconductor device may have a significantly increased on-state resistance or may even be disabled.

Optionally, a third semiconductor layer may further be provided between the first semiconductor layer 105 and the second semiconductor layer 106. Exemplarily, the third semiconductor layer may be an AlN layer, and the third semiconductor layer may reduce effects such as impurity scattering and increase a mobility of electrons in the channel.

Optionally, a fourth semiconductor layer and/or a fifth semiconductor layer may further be provided between the first semiconductor layer 105 and the substrate 100. Exemplarily, the fifth semiconductor layer may be a group III nitride buffer layer, and the fourth semiconductor layer 112 may be a nitride semiconductor layer such as an AlN layer.

Figure 5:
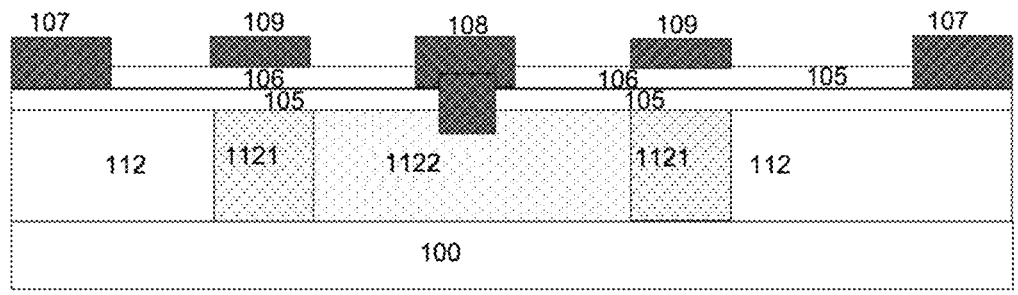
FIG. 5 illustrates a schematic cross-sectional view of a variation example of the semiconductor device structure of FIG. 1.

In this embodiment, as shown in FIG. 5, a weakly P-type doped fourth region 1122 and a strongly P-type doped third region 1121 may be formed in the fourth semiconductor layer 112.

When the semiconductor device of this embodiment has the fourth semiconductor layer, ion scattering at the channel is greatly reduced and the performance of the device is improved since the first semiconductor layer 105 is an intrinsic semiconductor layer (e.g., i-GaN) or an unintentionally doped semiconductor layer.

The structure of the semiconductor device according to this embodiment avoids the problems of both poor crystal quality and poor electrical properties of a P—GaN semiconductor layer caused by the growth of the semiconductor layer such as P—GaN after the first insulating layer 105 is formed on the first surface of the second semiconductor layer 106. With the structure of the semiconductor device, a high-quality P—GaN semiconductor layer can be obtained during or before fabrication of a channel, whereby the device can be kept in an OFF state with no current or with a very low gate leakage current in a case where the gate electrode is not biased, thereby achieving a reliable normally-off device having a lower on-resistance in an ON state.

Figure 6:
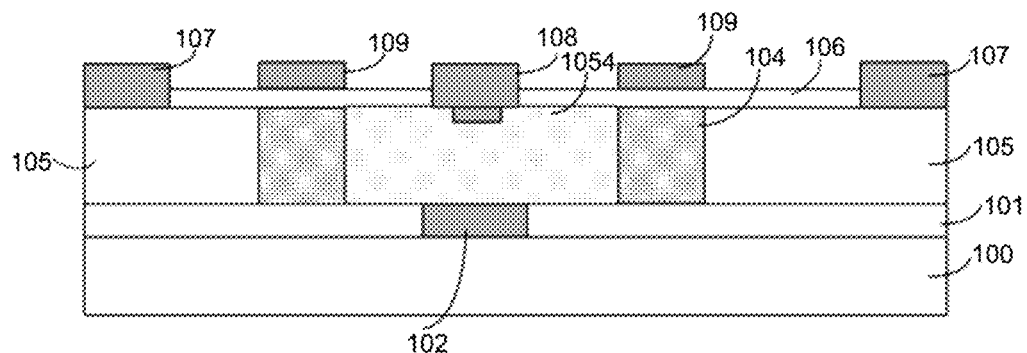
FIG. 6 illustrates a schematic cross-sectional view of another semiconductor device structure according to the present disclosure.

Referring to FIG. 6, another semiconductor device is proposed on the basis of the semiconductor device shown in FIG. 3. The semiconductor device may further comprise a first insulating layer 101 formed between the substrate 100 and the first semiconductor layer 105, a recess formed in the insulating layer under the second electrode 108, and a seed layer 102 formed in the recess. The seed layer 102 contributes to the formation of a nitride semiconductor layer having low roughness and a low dislocation density, and furthermore the seed layer located under the second electrode 108 also contributes to symmetric epitaxial growth of the first semiconductor layer 105 or the fourth semiconductor layer 112 during lateral epitaxy so as to improve the growth quality of the semiconductor layer and effectively utilize the wafer area.

Figure 7:
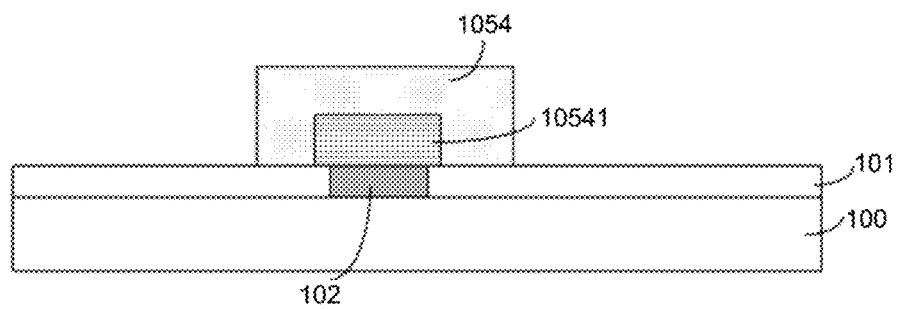
FIG. 7 illustrates a schematic cross-sectional view of yet another semiconductor device structure according to the present disclosure.

Referring to FIG. 7, there is shown yet another semiconductor device proposed on the basis of the semiconductor device shown in FIG. 6. Here, the weakly P-type doped second region 1054 of the first semiconductor layer may further have a buffer structure 10541, and the buffer structure 10541 helps to improve the crystal quality in the area-selective/lateral epitaxy.

Figure 8:
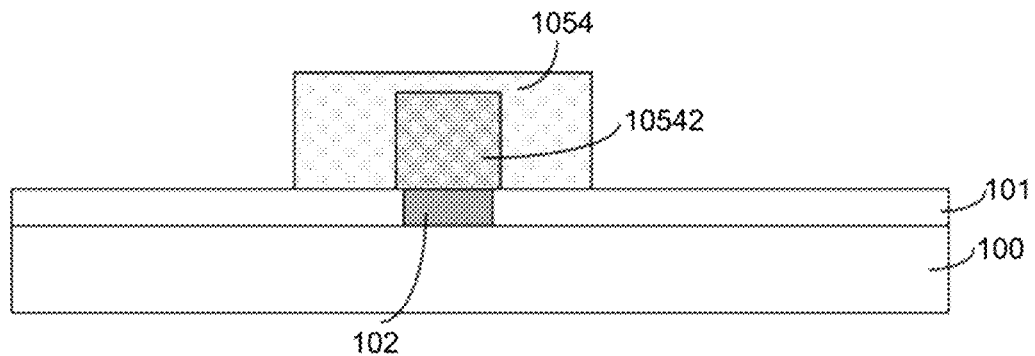
FIG. 8 illustrates a schematic cross-sectional view of still another semiconductor device structure according to the present disclosure.

Referring to FIG. 8, there is shown still another semiconductor device proposed on the basis of the semiconductor device shown in FIG. 6. Here, the weakly P-type doped second region 1054 of the first semiconductor layer may further have a strongly P-type doped third region 10542, and the strongly P-type doped third region 10542 helps to improve the quality of the subsequent P-type ohmic contact and reduce the contact resistance. Exemplarily, a dopant concentration of the above-mentioned strongly P-type doped third region 10542 may be set with reference to the dopant concentration of the first region 1053 described previously.

Figure 9:
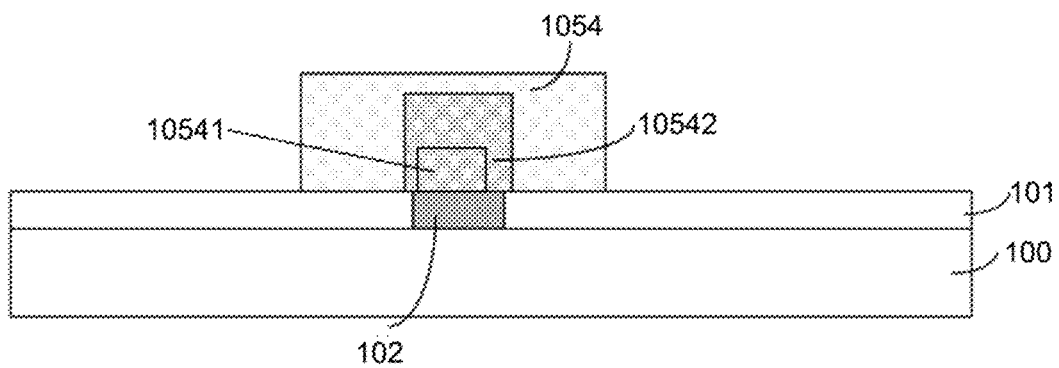
FIG. 9 illustrates a schematic cross-sectional view of still another semiconductor device structure according to the present disclosure.

Referring to FIG. 9, there is shown still another semiconductor device proposed on the basis of the semiconductor device shown in FIG. 6. Here, the weakly P-type doped second region 1054 of the first semiconductor layer may further have a buffer structure 10541 and a strongly P-type doped third region 10542, the buffer structure 10541 may be located in the third region 10542, the buffer structure 10541 helps to improve the crystal quality in the area-selective/lateral epitaxy, and the strongly P-type doped third region 10542 helps to improve the quality of the subsequent P-type ohmic contact and reduce the contact resistance.

Figure 10:
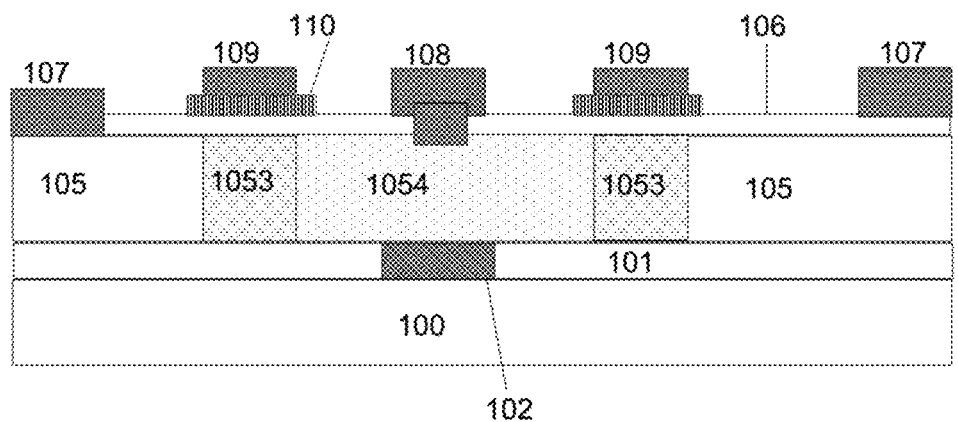
FIG. 10 illustrates a schematic cross-sectional view of still another semiconductor device structure according to the present disclosure.

Referring to FIG. 10, there is shown still another semiconductor device proposed on the basis of the semiconductor device shown in FIG. 6.

Here, a second insulating layer 110 may further be disposed between the second semiconductor layer 106 and the second electrode 108, and the second insulating layer 110 may be a silicon nitride layer. The silicon nitride layer can effectively protect the surface of the second semiconductor layer 106 such that the second semiconductor layer 106 or the second insulating layer 110 has fewer interface defect states, and the second insulating layer 110 may cover regions other than the first electrode 107 and the second electrode 108, or may be formed only at the third electrode 109 (i.e., at the gate stack) to act as a dielectric layer (gate dielectric layer) for the third electrode 109. The second insulating layer 110, which is disposed at the third electrode 109, can further reduce the gate leakage current of the third electrode 109 (gate) in the OFF state, and moreover the presence of the second insulating layer 110 can expand the voltage range of the third electrode 109 to enhance the reliability of the device. It will be understood that the insulating layer at the third electrode 109 may also be any other gate dielectric layer of, for example, silicon dioxide, $Al_2O_3$, or the like.

Figure 11:
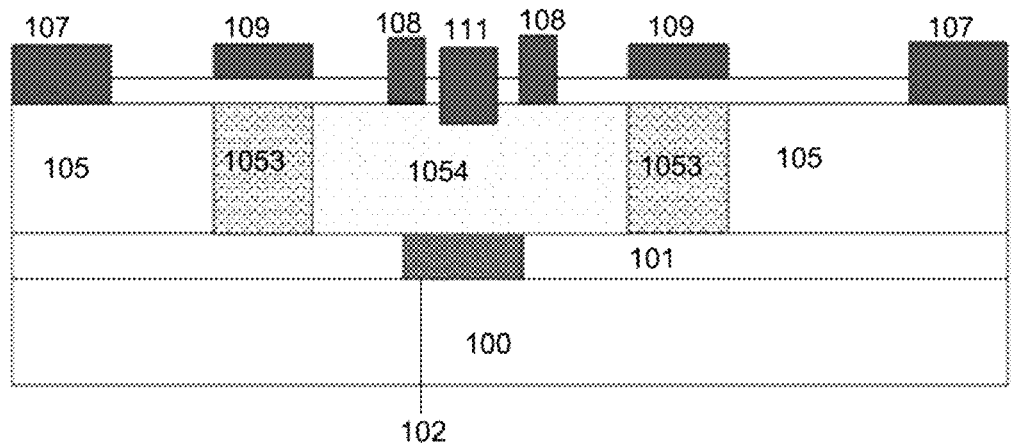
FIG. 11 illustrates a schematic cross-sectional view of still another semiconductor device structure according to the present disclosure.
Figure 12:
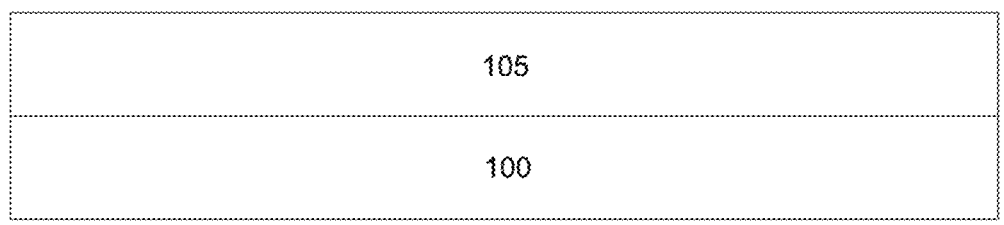
FIGS. 12 to 26 illustrate schematic cross-sectional views showing a method of manufacturing a semiconductor device according to the present disclosure.
Figure 13:
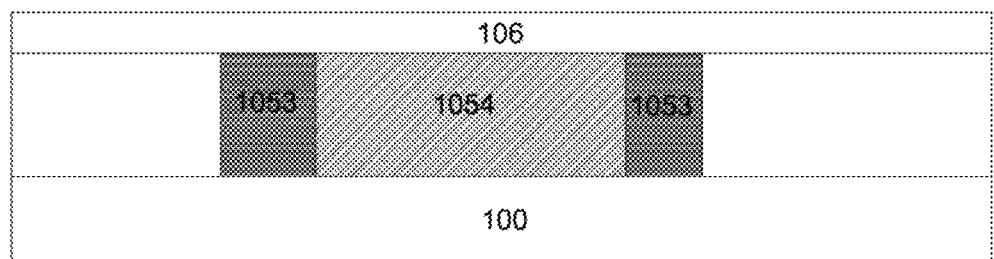
Figure 14:
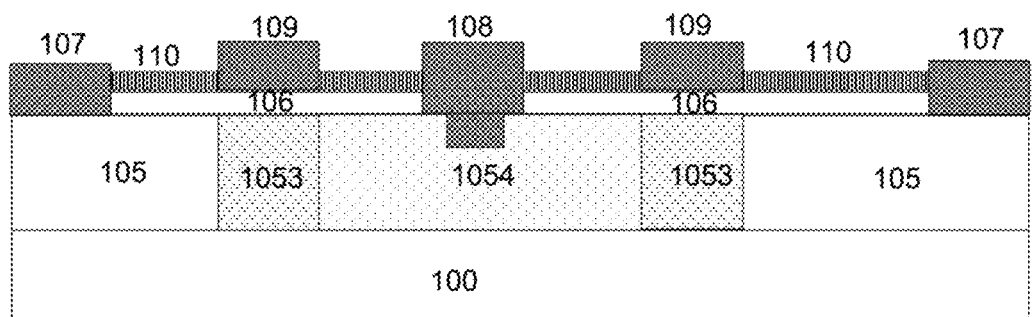
Figure 15:
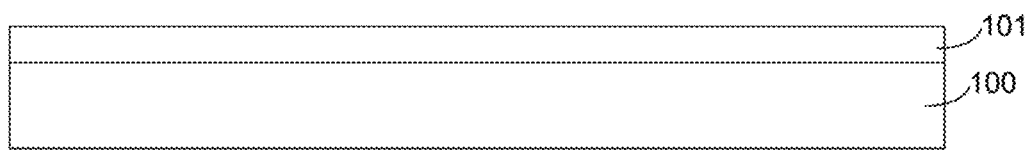
Figure 16:
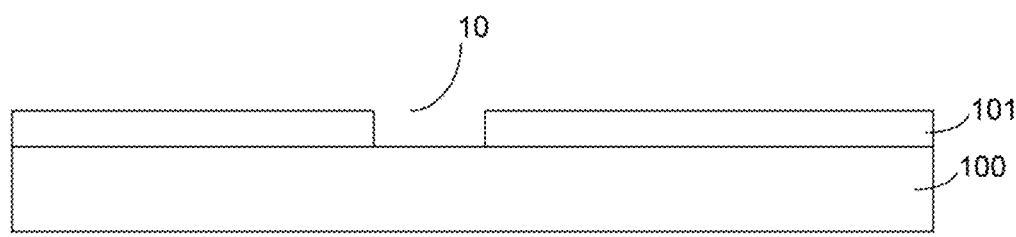
Figure 17:
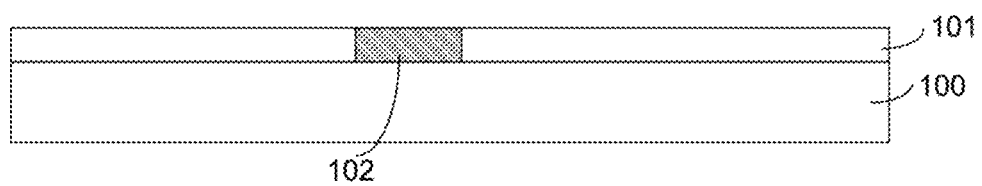
Figure 18:
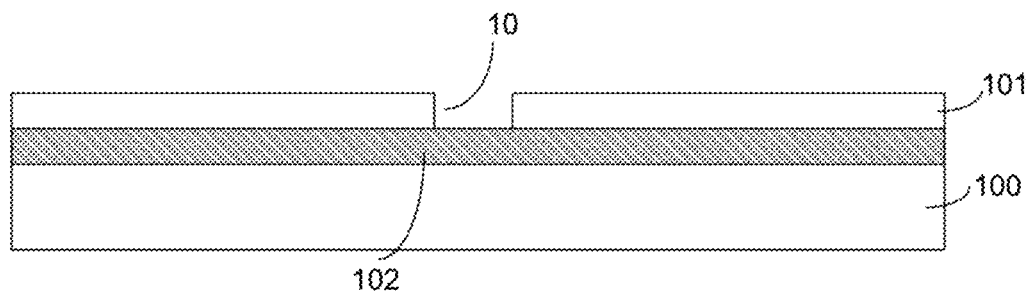
Figure 19:
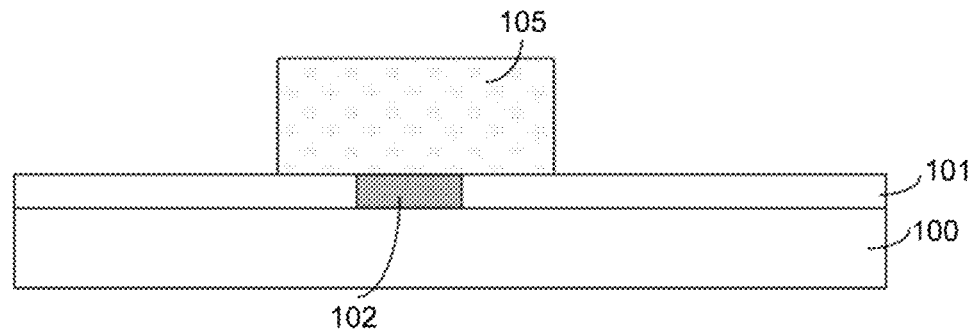
Figure 20:
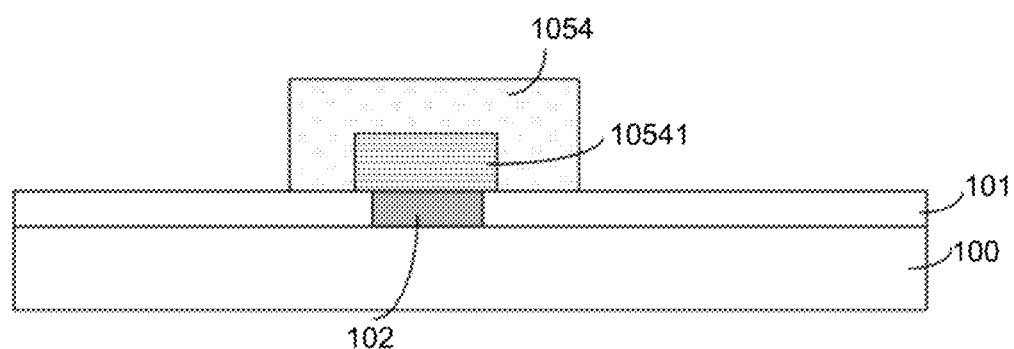

Referring to FIG. 11, there is shown a schematic view of still another semiconductor device according to this embodiment. The semiconductor device may further have, on the basis of the semiconductor device shown in FIG. 6, a fourth electrode 111 brought into contact with the weakly P-type doped first region 1054. The fourth electrode 111 is led out from either side of the weakly P-type doped second region 1054.

Exemplarily, the fourth electrode 111 may be led out from a side surface of the second region 1054; or may be led out from the first surface (i.e., the surface facing away from the first surface of the substrate 100) of the second region 1054; or may be led out from the second surface (i.e., the surface facing the first surface of the substrate 100) of the second region 1054. Thus, the potential of the fourth electrode 111 can be independently controlled, and thereby the weakly P-type doped second region 1054 and the strongly P-type doped first region 1053 are electrically connected by the fourth electrode 111.

A manufacturing method for manufacturing the semiconductor device of the first embodiment will now be exemplarily described with reference to FIGS. 12 to 26.

In step 100, a substrate 100 is provided. The material of the substrate 100 is selected with reference to the related description of the semiconductor device in FIGS. 1 to 5 and therefore will not be described in detail herein.

In step 200, the first semiconductor layer 105 (e.g., an intrinsic i-GaN layer or an unintentionally doped GaN layer) is formed on the substrate 100. A method for growth of the first semiconductor layer 105 is not particularly limited, and lateral epitaxial growth, hydride vapor phase epitaxy (HYPE), or the like may be used.

In step 300, a second semiconductor layer 106 is deposited and formed on the first semiconductor layer 105. Optionally, the second semiconductor layer 106 may be a layer of AlGaN, InAlGaN, InAlN, or the like. It is clear that a third semiconductor layer may also be deposited and formed on the first semiconductor layer 105 before the second semiconductor layer 106 is formed. Thus, a two-dimensional charge carrier gas is formed at an interface between the third semiconductor layer and the first semiconductor layer 105, or between the second semiconductor layer 106 and the first semiconductor layer 105.

In step 400, the strongly P-type doped first region and the weakly P-type doped second region are formed in the first semiconductor layer 105 by a doping process. The doping process may be an ion implantation or diffusion process, and the strongly P-type doped first region has an exemplary dopant concentration in an range between 1E17 atoms/cm$^3$ and 5E19 atoms/cm$^3$. Exemplarily, the strongly P-type doped first region 1053 may have a length of about 3.5 microns along a direction of flow of the two-dimensional carrier charges, and the strongly P-type doped first region may have a thickness of about 0.79 micro along a direction perpendicular to the direction of flow of the two-dimensional carrier charges.

In step 500, a second insulating layer is deposited and formed on the second semiconductor layer 106.

The second insulating layer may exemplarily be a silicon nitride layer formed by MOCVD, and the second insulating layer is used for protecting the underlying structural layers during subsequent annealing of ohmic contacts.

The second insulating layer may have a thickness of several to several hundred nanometers. The second insulating layer may be epitaxially grown in situ together with the respective structural layers of the semiconductor device, or alternatively, the second insulating layer is epitaxially grown in situ together with the second semiconductor layer 106 after other semiconductor layers are epitaxially grown prior to the growth of the second semiconductor layer and after the epitaxially grown other semiconductor layers are removed from the epitaxy device for processing treatment.

In step 600, the second insulating layer is etched to expose portions of the second semiconductor layer or the first semiconductor layer corresponding to the respective electrodes. Exemplarily, a N+ doped first portion of source and drain regions may be formed at a corresponding location by a doping process such as ion implantation, and then metal materials of a first electrode and a second electrode are formed on the exposed second semiconductor layer/first semiconductor layer by a process such as sputtering, evaporation, or the like, and subsequently a second portion for ohmic contacts of the first electrode and the second electrode (source/drain) is formed by etching and annealing. Here, the doping element of the first portion may be the same as or different from the metal element of the second portion. It will be understood that the N+ doped first portion can improve the ohmic contact performance, but the first portion is not essential and may be omitted in the production. Then, a third electrode 109 is formed by a conventional process at a corresponding region of the second semiconductor layer 106 at which the third electrode is to be formed, and the third electrode 109 may be brought into direct contact with the second semiconductor layer 106.

In this embodiment, the detailed process of the lateral epitaxy in the step 200 may comprise the following steps 210 to S240.

In step 210, the first insulating layer 101 is deposited and formed on the first surface of the substrate 100 in such a manner that the first insulating layer 101 covers the entire surface of the substrate 100; at least a portion of the first insulating layer 101 is removed, for example, at least a portion of the first insulating layer 101 corresponding to a region at which the second electrode 108 (source) will be formed later is removed, so as to form an opening to partially expose the substrate 100; and then a seed layer 102 is deposited and formed on the substrate 100 exposed by the opening of the first insulating layer 101 by a deposition process. The seed layer 102 and the first insulating layer 101 each have a second surface opposite to the first surface 1001 of the substrate 100, and a first surface facing away from the first surface of the substrate 100. Here, the material of the first insulating layer 101 is not limited. The material of the seed layer 102 may be selected from any material that can serve as a core for growth of the first semiconductor layer 105.

Optionally, the step 210 may be replaced by step 210'. The step 210' is carried out as follows:

First, a seed material is deposited and formed on the first surface of the substrate 100, and a portion of the seed material is removed by photolithography to expose the first surface of the substrate 100, so that the retained seed material forms a seed layer, wherein the seed layer serves as a core for growth of the first semiconductor layer 105, for example, the retained region for the seed layer is a region at which a second electrode (source) region is to be formed later. Then, an insulating material is deposited on the first surface of the substrate 100 to fully cover the substrate 100 and the seed layer, and is subjected to an etching or planarization process until the seed layer is exposed. The seed layer and the first insulating layer each have a second surface opposite to the first surface of the substrate 100, and a first surface facing away from the first surface of the substrate 100.

In step 220, a nitride semiconductor including an unintentionally doped nitride semiconductor or an intrinsic nitride semiconductor is laterally epitaxially grown with the seed layer as a center on the first surfaces of both the second insulating layer and the seed layer, or on the first surface(s) of the first insulating layer and/or the seed layer; a growth rate of the nitride semiconductor is controlled to stop the growth of the nitride semiconductor before the nitride semiconductor fully covers the insulating layer and/or the seed layer, so that a first portion of the first semiconductor layer is formed. It will be understood that, in this step, the first semiconductor layer 105 may be fully doped by adjusting the dopant concentration; or the first semiconductor layer may be subjected to strong P-type doping followed by weak P-type doping; or the first semiconductor layer may be subjected to weak P-type doping after an undoped structure is formed; or the first semiconductor layer may be subjected to strong P-type doping followed by weak P-type doping after an undoped structure is formed.

In step 230, with the grown first portion of the first semiconductor layer as a core, a strongly P-type doped nitride semiconductor layer is continuedly grown on its top surface and side surface, and after the strongly P-type doped nitride semiconductor layer with a certain thickness is grown, a growth of a low-doped or undoped nitride semiconductor layer is continued, wherein the low-doped or undoped nitride semiconductor layer forms a partial connection region of the first semiconductor layer. Then, the partial connection region and the strongly P-type doped nitride semiconductor layer may be partially removed by a method such as CMP or etching or the like to expose the weakly P-type doped nitride semiconductor layer, so that the formed first semiconductor layer 105 comprises the strongly P-type doped region 1053 and the weakly P-type doped region 1054, or comprises the strongly P-type doped region 1053 and the weakly P-type doped region 1054 in which a buffer layer 10541 and/or a strongly P-type doped region 10542 is embedded.

Optionally, in the step 230, the strongly P-type doped nitride semiconductor layer may be formed only in a region of orthographic projection of the third electrode 109 to be formed later. More specifically, the strongly P-type doped nitride layer or the weakly P-type doped nitride layer such as P—GaN is laterally grown in a direction which is the [11$\bar{2}$0] crystal orientation, and has a growth plane which may be a vertical [11$\bar{2}$0] plane. Exemplarily, the strongly P-type doped nitride layer may have a specific size of about 1 micron in length and about 2 microns in height. When the lateral growth direction is the crystal orientation, P—GaN is laterally grown at a faster speed and the device has more excellent performance as compared with the case where P—GaN is laterally grown in the crystal orientation and has a stable growth plane which is an inclined [1$\bar{1}$01] plane.

Optionally, in the step 230, the connection region and the strongly P-type doped region may be partially removed by an etching or planarization process to expose the weakly P-type doped region. It will be understood that the strongly P-type doped layer which is extremely thin may be retained on the weakly P-type doped layer, or the etching or planarization process may be continued after the weakly P-type doped region is retained, so that the connection region and the strongly P-type doped region and the weakly P-type doped region are further partially removed.

It will be understood that the step 230 may be performed repeatedly several times to produce the discrete strongly P-type doped regions as described in the figures.

In step 240, the first semiconductor layer 105 is continuously grown with the structure formed in the above step 230 as a nucleation center until the first semiconductor layer 105 fully covers the first insulating layer 101 and/or the seed layer. The continuedly grown first semiconductor layer may be weakly P-type doped, or the continuedly grown first semiconductor layer may be an intrinsic nitride semiconductor layer or an unintentionally doped semiconductor layer so that the growth of the connection region is completed. Exemplarily, the etching or planarization process may be performed such that the first surfaces of the connection region, the strongly P-type doped region, and the weakly P-type doped region are coplanar with one another. Then, structural layers such as a second semiconductor layer 106 and a second insulating layer 110 are sequentially formed. It is clear that during the growth of the strongly P-type doped nitride region, the strongly P-type doped region doped at a concentration gradually varying along a single side or both sides as described in the semiconductor device shown in FIG. 1 can be achieved by controlling the P-type dopant concentration during the process. The specific form of P-type doping is not specifically limited herein.

It will be understood that the second insulating layer fully covering the second semiconductor layer may be formed in situ on the second semiconductor layer before the step 500, and exemplarily, the second insulating layer may be made of silicon nitride.

Figure 21:
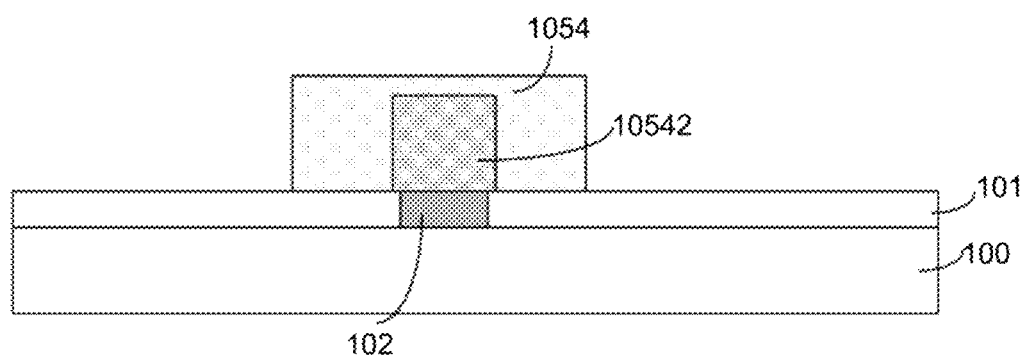
Figure 22:
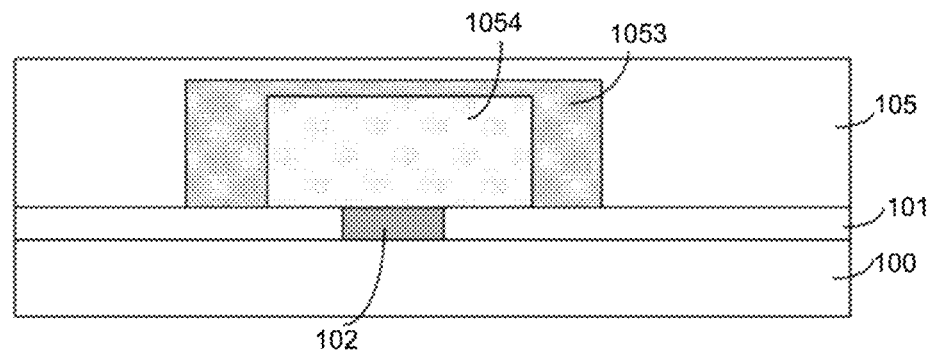
Figure 23:
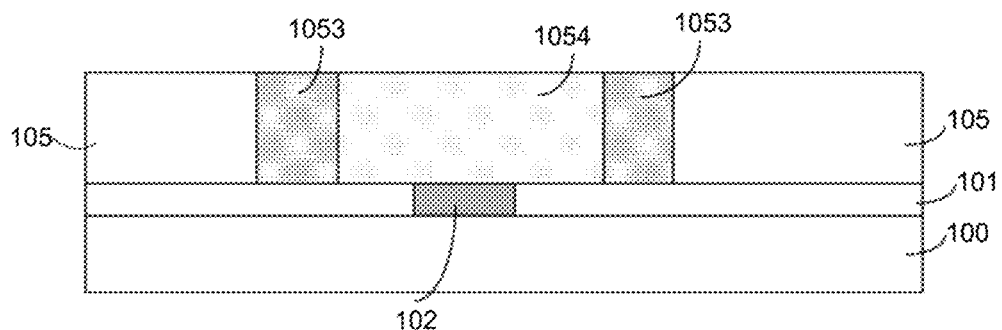
Figure 24:
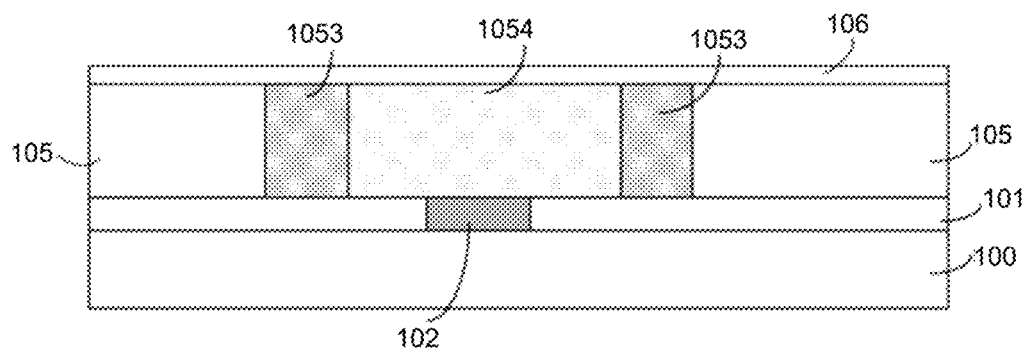
Figure 25:
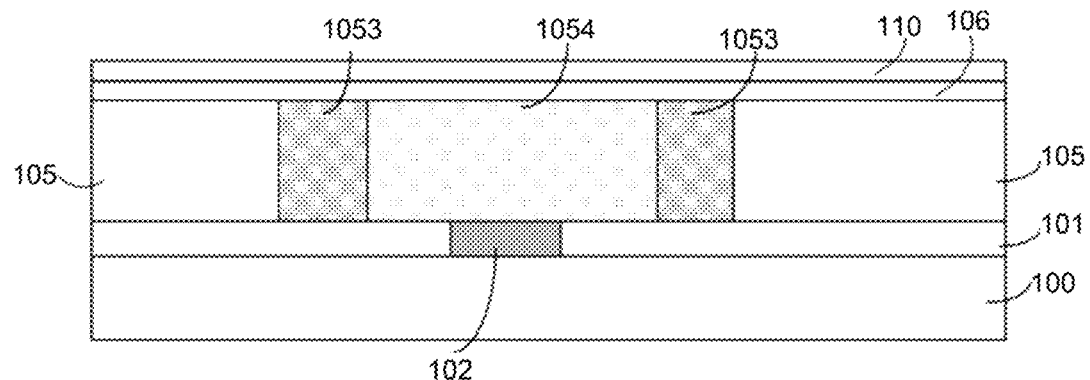
Figure 26:
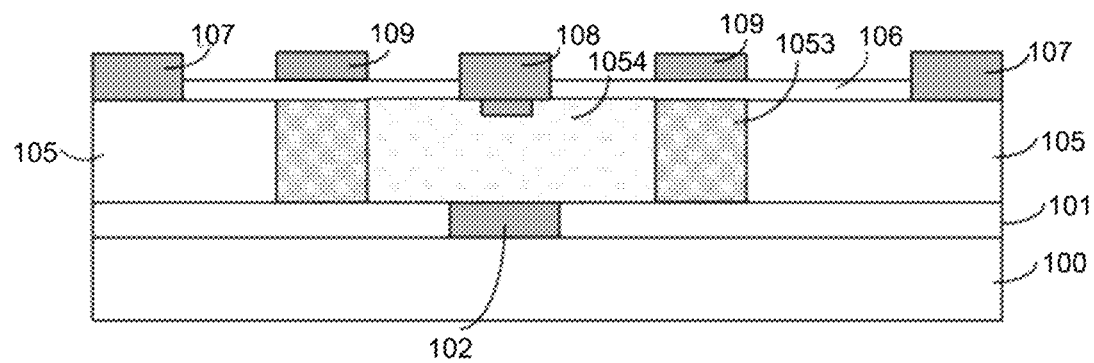
Figure 27:
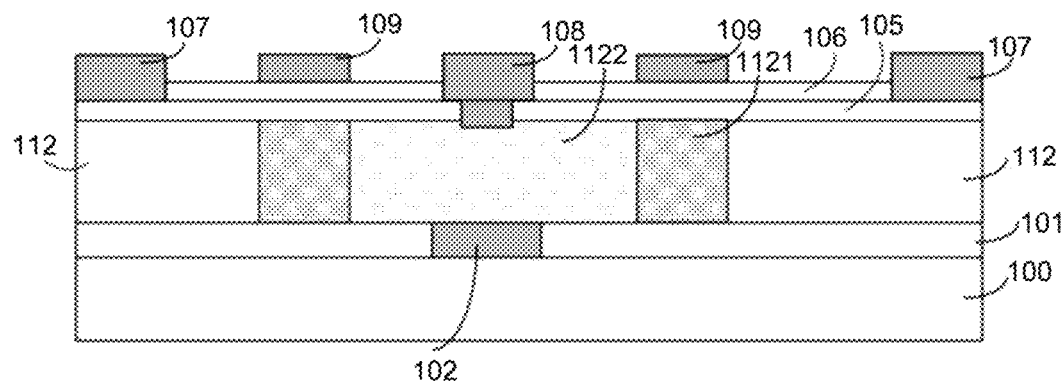
FIG. 27 illustrates a schematic cross-sectional view showing another method of manufacturing a semiconductor device according to the present disclosure.

Optionally, in the step 220, the fifth semiconductor layer 112 may be laterally epitaxially formed on the first surfaces of the second insulating layer and the seed layer with the seed layer as a center as shown in FIG. 21. Thereafter, a strongly P-type doped region 1121 and a weakly P-type doped region 1122 in the fifth semiconductor layer 112 are laterally epitaxially formed with the seed layer as a center. The method of forming these regions is the same as the method of forming the strongly P-type doped region and the weakly P-type doped region in the first semiconductor layer 105 described previously, and therefore will not be described in detail herein. Then, other structures such as the first semiconductor layer 105, the second semiconductor layer 106, and the like are sequentially formed in accordance with the steps of the manufacturing method described previously, wherein an exemplary structure comprising the fifth semiconductor layer 112 is shown in FIG. 27.

In this embodiment, on the basis of the steps of the manufacturing method described above, the back surface of the substrate may be etched to form a through hole extending up to the weakly P-type doped region, and an electrode material is deposited in the hole and etched to form a fourth electrode.

Figure 28:
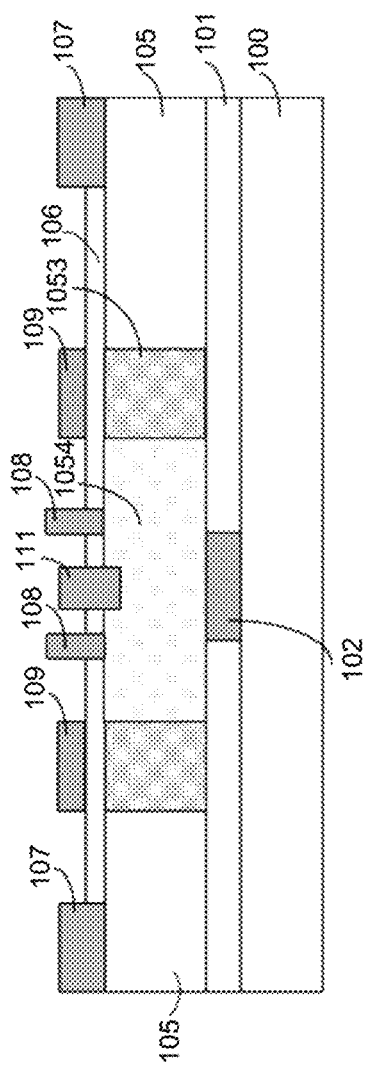
FIG. 28 illustrates a schematic cross-sectional view showing a method of manufacturing a semiconductor device according to the present disclosure.

Alternatively, referring to FIG. 28, the surface of the passivation layer may be etched to form a through hole extending up to the weakly P-type doped region, and an electrode material is deposited in the hole and etched to form a fourth electrode.

The present disclosure also provides an electronic apparatus such as a power supply apparatus, which may comprise a semiconductor device described in any of the above embodiments. The power supply apparatus may further comprise a primary circuit, a secondary circuit, a transformer, and the like, wherein the primary circuit and the secondary circuit each comprise a switching element, and the switching element may comprise a semiconductor device described in any of the above embodiments.

The present disclosure also provides a mobile phone comprising a semiconductor device described in any of the above embodiments. The mobile phone comprises a display screen, a charging unit, and the like, wherein the charging unit comprises a semiconductor device described in any of the above embodiments.

The present disclosure also provides an amplifier, which may be a power amplifier applicable to the field of mobile phone base stations or the like, wherein the power amplifier may comprise a semiconductor device described in any of the above embodiments.

Although the present disclosure has been described above in connection with the optional embodiments, it should be understood by those skilled in the art that all these descriptions are exemplary and are not intended to limit the scope of protection of the present disclosure. Those skilled in the art can make various variations and modifications of the present disclosure based on the spirit and principles of the present disclosure, and such variations and modifications are also within the scope of the present disclosure.

INDUSTRIAL APPLICABILITY

The semiconductor device and the method of manufacturing the same according to the present disclosure can reduce a gate leakage current, have a high threshold voltage, high power, and high reliability, allow a low on-resistance and a normally-off state of the device, and can provide a stable threshold voltage, so that the semiconductor device has good switching characteristics.

What is claimed is:

1. A semiconductor device, comprising:
    a substrate;
    a first semiconductor layer on a first surface of the substrate;
    a second semiconductor layer on a first surface of the first semiconductor layer;
    a two-dimensional charge carrier gas being generating between the first semiconductor layer and the second semiconductor layer; and
    a first electrode, a second electrode, and a third electrode on the second semiconductor layer,
    wherein the first semiconductor layer further comprises at least one strongly P-type doped first region and at least one weakly P-type doped second region; the at least one first region is located under the third electrode, and the at least one second region is located under the second electrode, and
    when the third electrode has a bias voltage of 0, the two-dimensional charge carrier gas in at least a portion of a region corresponding to the third electrode has a concentration lower than $5E+11/cm^2$.

2. The semiconductor device according to claim 1, wherein the first semiconductor layer has a forbidden band width smaller than that of the second semiconductor layer.

3. The semiconductor device according to claim 1, wherein the at least one first region and the at least one second region are connected to each other.

4. The semiconductor device according to claim 1, wherein a portion where one first region is projected onto the substrate is located in a portion where the third electrode is projected onto the substrate.

5. The semiconductor device according to claim 1, wherein the two-dimensional charge carrier gas in the at least one second region has a concentration not lower than $2E+12/cm^2$.

6. The semiconductor device according to claim 1, wherein the at least one first region in the first semiconductor layer undergoes epitaxy in a direction parallel to the substrate which is a direction, and undergoes lateral epitaxy in a direction [1120].

7. The semiconductor device according to claim 1, wherein the at least one first region depletes 95% to 100% of the two-dimensional charge carrier gas at an overlapping portion between the at least one first region and the region where the third electrode is projected.

8. The semiconductor device according to claim 1, wherein the at least one first region is in a single layer structure or comprises at least two discrete layers, wherein the at least two discrete layers are disposed along a direction perpendicular to the substrate or disposed along a direction parallel to the substrate.

9. The semiconductor device according to claim 8, wherein the at least two discrete layers are in close contact with each other; or
    the at least two discrete layers are spaced apart by a space which is located in one of the at least one weakly P-type doped region.

10. The semiconductor device according to claim 1, wherein the at least one first region has a gradually varying dopant concentration.

11. The semiconductor device according to claim 10, wherein the concentration of the at least one first region gradually varies in a manner as follows: gradually varying along a single side, or gradually varying from a center of the at least one first region to both sides parallel to a direction of the substrate, or gradually varying from the center of the at least one first region to both sides perpendicular to the direction of the substrate.

12. The semiconductor device according to claim 1, further comprising at least one of:
    a third semiconductor layer located between the first semiconductor layer and the second semiconductor layer;
    a fourth semiconductor layer located between the first semiconductor layer and the substrate; and
    a fifth semiconductor layer located between the first semiconductor layer and the substrate.

13. The semiconductor device according to claim 12, wherein the third semiconductor layer is an aluminum nitride layer, the fourth semiconductor layer is a nitride semiconductor layer, and the fifth semiconductor layer is a Group III nitride buffer layer.

14. The semiconductor device according to claim 12, further comprising a first insulating layer formed between the first semiconductor layer and the substrate, wherein a seed layer is disposed in the first insulating layer, and the seed layer is located under the second electrode.

15. A method of manufacturing a semiconductor device according to claim 1, comprising:
    a step (100) of providing a substrate;
    a step (200) of forming a first semiconductor layer on a first surface of the substrate;
    a step (300) of forming at least one weakly P-type doped second region and at least one strongly P-type doped first region in the first semiconductor layer;
    a step (400) of forming a second semiconductor layer on a first surface of the first semiconductor layer;
    a two-dimensional charge carrier gas being generated between the first semiconductor layer and the second semiconductor layer; and
    a step (500) of forming a first electrode and a second electrode in ohmic contact with the two-dimensional charge carrier gas, and forming a third electrode on a side of a first surface of the second semiconductor layer,
    wherein the at least one first region is located under the third electrode, and the at least one second region is located under the second electrode.

16. The method according to claim 15, wherein the step (200) comprises a step (210) of:
    depositing and forming a first insulating layer on the first surface of the substrate, removing at least a portion of the first insulating layer corresponding to a portion at which the third electrode will be formed later, thereby forming an opening to expose a portion of the substrate, and then depositing and forming a seed layer on the first insulating layer having the opening.

17. The method according to claim 16, wherein the step (200) further comprises a step (220) of:
    laterally epitaxially growing an unintentionally doped nitride semiconductor or an intrinsic nitride semiconductor, on at least one first surface of the first insulating layer and/or the seed layer with the seed layer as a center, and controlling its growth rate to stop the growth of the nitride semiconductor before the nitride semiconductor fully covers the first insulating layer and/or the seed layer, so that a first portion of the first semiconductor layer is formed.

18. The method according to claim 17, wherein the step (220) further comprises: making the entire first portion subject to weak P-type doping; or making the first portion subject to strong P-type doping followed by weak P-type doping; or making the first portion subject to weak P-type doping after an unintentionally doped or intrinsic nitride semiconductor structure is formed; or making the first portion subject to strong P-type doping followed by weak P-type doping after an unintentionally doped or intrinsic nitride semiconductor structure is formed.

19. The method according to claim 18, wherein the step (200) further comprises a step (230) of:
    continuing the growth of a strongly P-type doped nitride layer, with the grown first portion of the first semiconductor layer as a center, on its top surface and side surface, continuing to grow a low-doped or undoped nitride semiconductor layer, which forms a connection region of the first semiconductor layer, after a strongly P-type doped nitride semiconductor layer with a certain thickness is grown, and then partially removing the connection region and the strongly P-type doped nitride semiconductor layer to expose the weakly P-type doped nitride semiconductor layer.

* * * * *